US006641976B2

(12) United States Patent
Vermeersch et al.

(10) Patent No.: US 6,641,976 B2
(45) Date of Patent: Nov. 4, 2003

(54) METHOD OF MAKING A NEGATIVE-WORKING HEAT-SENSITIVE LITHOGRAPHIC PRINTING PLATE PRECURSOR

(75) Inventors: Joan Vermeersch, Deinze (BE); Marc Van Damme, Bonheiden (BE)

(73) Assignee: AGFA-Gevaert (BE)

(*) Notice: Subject to any disclaimer, the term of this patent is extended or adjusted under 35 U.S.C. 154(b) by 46 days.

(21) Appl. No.: 10/087,244

(22) Filed: Mar. 1, 2002

(65) Prior Publication Data

US 2002/0168582 A1 Nov. 14, 2002

Related U.S. Application Data

(60) Provisional application No. 60/291,527, filed on May 16, 2001.

(30) Foreign Application Priority Data

Mar. 20, 2001 (EP) ........................................... 01000059

(51) Int. Cl.[7] ................................................ G03F 7/038

(52) U.S. Cl. .................... 430/270.1; 430/302; 430/348; 430/138; 430/434; 430/494; 430/944; 430/945; 101/453; 101/463.1; 101/467

(58) Field of Search .............................. 430/138, 270.1, 430/302, 348, 401, 434, 494, 495.1, 944, 945, 964; 101/453, 463.1, 467

(56) References Cited

U.S. PATENT DOCUMENTS 5,981,144 A * 11/1999 Damme et al. .......... 430/271.1
6,197,478 B1 * 3/2001 Vermeersch et al. ..... 430/272.1

FOREIGN PATENT DOCUMENTS

| | | | |
|---|---|---|---|
| EP | 0 770 497 | A1 | 5/1997 |
| EP | 0 773 112 | A1 | 5/1997 |
| EP | 0 773 113 | A1 | 5/1997 |
| EP | 0 839 647 | A1 | 5/1998 |
| EP | 0 881 096 | A1 | 12/1998 |
| EP | 1 080 884 | A1 | 5/2001 |

OTHER PUBLICATIONS

Search Report for EP 01 00 0059 dated Aug. 20, 2001.

* cited by examiner

*Primary Examiner*—Janet Baxter
*Assistant Examiner*—Barbara Gilliam
(74) *Attorney, Agent, or Firm*—Leydig, Voit & Mayer, Ltd.

(57) ABSTRACT

A method of making a negative-working heat-sensitive lithographic printing plate precursor is disclosed, the method comprising the steps of (a) preparing an aqueous dispersion comprising particles of a hydrophobic thermoplastic polymer A which is not soluble or swellable in an aqueous alkaline developer and particles of a polymer B which is soluble or swellable in an aqueous alkaline developer but not soluble or swellable in water, wherein the glass transition temperature of polymer A is higher than the softening temperature of polymer B;

(b) applying the aqueous dispersion on a lithographic substrate having a hydrophilic surface, thereby obtaining an image-recording layer;

(c) overall heating the image-recording layer at a temperature which is higher than the softening temperature of polymer B without inducing coalescense of the particles of polymer A.

The printing plate precursor has improved mechanical resistance.

17 Claims, No Drawings

METHOD OF MAKING A NEGATIVE-WORKING HEAT-SENSITIVE LITHOGRAPHIC PRINTING PLATE PRECURSOR

RELATED APPLICATIONS

This application claims the benefit of U.S. provisional application No. 60/291,527, filed May 16, 2001, which is incorporated by reference.

FIELD OF THE INVENTION

The present invention relates to a method of preparing a negative-working printing plate precursor having a hydrophilic substrate and a heat-sensitive image-recording layer provided thereon as well as a method of making a printing plate using such a material.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'.

In addition to the above photosensitive materials, also heat-sensitive printing plate precursors are known. Such materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross-linking of a polymer, decomposition, or particle coagulation of a thermoplastic polymer latex. Especially the latter imaging mechanism allows to obtain a daylight-stable material with high lithographic performance and typical prior art examples of such heat-sensitive materials will now be discussed.

Research Disclosure no. 33303 of January 1992 discloses a heat-sensitive imaging element comprising on a support a cross-linked hydrophilic layer containing a latex of thermoplastic polymer particles and an infrared absorbing pigment such as e.g. carbon black. By image-wise exposure to an infrared laser, the thermoplastic polymer particles are image-wise coagulated thereby rendering the exposed areas ink-receptive without any further development.

EP-A-514145 discloses a heat-sensitive imaging element including a coating comprising core-shell particles having a water insoluble heat softenable core component and a shell component which is soluble or swellable in aqueous alkaline medium. Red or infrared laser light directed image-wise at said imaging element causes selected particles to coalesce, at least partially, to form an image and the non-coalesced particles are then selectively removed by means of an aqueous alkaline developer. Afterwards a baking step is performed.

EP-A-800928 discloses a heat sensitive imaging element comprising on a hydrophilic surface of a lithographic base an image forming layer comprising hydrophobic thermoplastic polymer particles dispersed in a water insoluble and alkali soluble or swellable resin and a compound capable of converting light into heat, wherein said alkali swellable or soluble resin comprises phenolic hydroxy groups and/or carboxyl groups.

The major problem associated with the prior art compositions which work according to heat-induced latex coalescence is the ease of mechanical damage of the image-recording layer of such materials which may cause a low run length of the printing plate and/or ink-acceptance in the non-printing areas (toning), e.g. due to some pressure applied thereto.

SUMMARY OF THE INVENTION

It is an object of the present invention to provide a composition that enables to make a lithographic printing plate precursor which works according to heat-induced coalescence or fusing of hydrophobic thermoplastic polymer particles and which allows to obtain a high run length without toning. This object is realized by the method defined in claim 1. Specific features for preferred embodiments of the invention are set out in the dependent claims. The use of a polymer B which has a softening temperature that is lower than the glass transition temperature of the hydrophobic thermoplastic particles of polymer A allows to heat the composition up to a temperature above the softening temperature of polymer B without substantially triggering the image mechanism of heat-induced fusing or coalescence of the particles of polymer A.

Further advantages and embodiments of the present invention will become apparent from the following description.

DETAILED DESCRIPTION OF THE INVENTION

According to the method of the present invention, an aqueous dispersion of at least two polymers is prepared, referred to herein as polymer A and polymer B. The glass transition temperature of polymer A is higher than the softening temperature of polymer B. The softening temperature is the temperature at which the polymer begins to deform from a rigid state to a soft state, which normally occurs at a rapid rate over a narrow temperature interval. For amorphous polymers the softening temperature is near the glass transition temperature, whereas for highly crystalline polymers it is close to the melting point. The term "aqueous" shall be understood as meaning that more than 50 wt. % of the solvent is water. Organic liquids which are miscible with water can be present, e.g. alcohols, ketones, or derivatives thereof, but preferably only water is used as a solvent.

Polymer A is a hydrophobic thermoplastic polymer that is not soluble or swellable in an aqueous alkaline developer. Specific examples of suitable hydrophobic polymers are e.g. polyethylene, poly(vinyl chloride), poly(methyl (meth) acrylate), poly(ethyl (meth)acrylate), poly(vinylidene chloride), poly(meth)acrylonitrile, poly(vinyl carbazole), polystyrene or copolymers thereof. Polystyrene and poly (meth)acrylonitrile or their derivatives are highly preferred embodiments of polymer A. According to such preferred embodiments, polymer A comprises at least 50 wt. % of polystyrene, and more preferably at least 65 wt. % of polystyrene. In order to obtain sufficient resistivity towards organic chemicals, such as the hydrocarbons used in plate cleaners, polymer A preferably comprises at least 5 wt. %, more preferably at least 30 wt. % of nitrogen containing units or of units which correspond to monomers that are characterized by a solubility parameter larger than 20, such as (meth)acrylonitrile. According to the most preferred embodiment, polymer A consists of styrene and acrylonitrile units in a weight ratio between 1:1 and 5:1 (styrene:acrylonitrile), e.g. in a 2:1 ratio.

The weight average molecular weight of the polymer A may range from 5,000 to 1,000,000 g/mol. The hydrophobic particles of polymer A preferably have a number average particle diameter below 200 nm, more preferably between 10 and 100 nm. The amount of hydrophobic thermoplastic polymer particles contained in the image-recording layer is preferably between 20% by weight and 65% by weight and more preferably between 25% by weight and 55% by weight and most preferably between 30% by weight and 45% by weight.

The particles of polymer A are present as a dispersion in an aqueous coating liquid of the image forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

Polymer B is soluble or swellable in an aqueous alkaline developer but not soluble or swellable in water (i.e. at about neutral pH). Just as polymer A, polymer B is also present as particles in the aqueous dispersion because the pH of the dispersion is not sufficiently high to cause dissolution of the particles of polymer B. The polymer B comprises preferably a hydrophobic binder such as a phenolic resin, e.g. a novolac or resole resin, and/or a polymer containing a carboxy group, a sulfonamide group, a nitrile group, a maleimide group or a maleimidosulfadimidine group. Polymer B preferably has a softening temperature below 100° C., more preferably below 75° C. and most preferably below 50° C.

The weight ratio of the polymers A/B in the aqueous dispersion that is coated on the substrate is preferably larger than 0.5, more preferably larger than 0.6 and most preferably larger than 0.7.

The dispersion of polymer A and B that, according to the method of the present invention, is applied to the lithographic substrate, may also contain other ingredients such as additional binders, surfactants, colorants, development inhibitors or accelerators, and especially one or more compounds that are capable of converting infrared light into heat. Particularly useful compounds are for example infrared dyes, carbon black, metal carbides, borides, nitrides, carbonitrides, bronze-structured oxides, and conductive polymer dispersions such as polypyrrole, polyaniline or polythiophene-based conductive polymer dispersions.

The substrate used in the methods of the present invention has a hydrophilic surface. The substrate may be a sheet-like material such as a plate or it may be a cylindrical element such as a sleeve which can be slid around a print cylinder of a printing press. Alternatively, the substrate can also be the print cylinder itself. In the latter option, the image-recording layer is provided on the print cylinder, e.g. by on-press spraying as described below. The lithographic substrate may be a hydrophilic support or a support which is provided with a hydrophilic layer. Preferably, the support is a metal support such as aluminum or stainless steel.

A particularly preferred lithographic substrate is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the substrate can also be a flexible support, which is provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called substrate layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg/m$^2$ and 750 mg/m$^2$. Further, the ratio of silica to hydrophilic binder is preferably more than 1 and the surface area of the colloidal silica is preferably at least 300 m$^2$/gram, more preferably at least 500 m$^2$/gram.

The imaging layer can be applied on the lithographic substrate before or after mounting the substrate on the print cylinder of a printing press, unless the lithographic substrate is the print cylinder itself, as described above. In a preferred embodiment, the dispersion is coated, sprayed or jetted on-press onto the substrate and exposed on-press by means of an integrated exposure apparatus. Alternatively, the dispersion is coated on the substrate in an off-press apparatus and then mounted on the print cylinder. The above compositions are also suitable for on-press cleaning after the press-run, e.g. by spraying or jetting a cleaning composition on the master, thereby removing the printing areas from the substrate which can then be reused in a next cycle of coating, exposing, printing and cleaning.

After the image-recording layer has been applied on the substrate, it is heated to a temperature above the softening temperature of polymer B and preferably below the glass transition temperature of polymer A. Depending on the time and temperature of the heating step, it may result in a slight, a partial or complete fusing of the particles of polymer B which may lead to the formation of a film matrix wherein the particles of polymer A are dispersed. The heating may be performed during the drying of the coated layer, or otherwise the drying may be carried out at a lower temperature, e.g. room temperature, and then the heating may be performed as a separate step after the drying.

The imaging materials used in the present invention are exposed to heat or to infrared light, e.g. by means of a thermal head, LEDs or an infrared laser. Preferably, a laser emitting near infrared light having a wavelength in the range from about 700 to about 1500 nm is used, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at 1/e$^2$ of maximum intensity 10–25 $\mu$m), the scan speed and the resolution of the exposure apparatus (i.e. the number of addressable pixels per unit of linear distance, often expressed in dots per inch or dpi; typical value: 1000–4000 dpi). Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical laser power from about 200 mW to about 1 W operate at a lower scan speed, e.g. from 0.1 to 10 m/sec.

The known plate-setters can be used as an off-press exposure apparatus in the present invention. This offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

Due to the heat generated during the exposure step, the particles of polymer A fuse or coagulate so as to form a hydrophobic phase which corresponds to the printing areas of the plate precursor. Coagulation may result from heat-induced coalescence, softening or melting of the thermoplastic polymer particles. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. The coagulation temperature is preferably higher than 50° C., more preferably above 100° C.

In the development step, the non-exposed areas of the image-recording layer are removed by supplying an aqueous alkaline developer, which may be combined with mechanical rubbing, e.g. by a rotating brush. The development step may be followed by a drying step, a rinsing step and/or a gumming step. After the development, it is still possible to bake the plate at a temperature which is higher than the glass transition temperature of polymer A, e.g. between 100° C. and 230° C. for a period of 40 minutes to 5 minutes. For example the exposed and developed plates can be baked at a temperature of 230° C. for 5 minutes, at a temperature of 150° C. for 10 minutes or at a temperature of 120° C. for 30 minutes.

EXAMPLES

Preparation of a Lithographic Substrate

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m$^2$ to form a surface topography with an average centre-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulphuric acid at a temperature of 45° C., a voltage of about 10 V and a current density of 150 A/m$^2$ for about 300 seconds to form an anodic oxidation film of 3.00 g/m$^2$ of $Al_2O_3$ then washed with demineralized water, post-treated with a solution containing polyvinylphosphonic acid and subsequently with a solution containing aluminum trichloride, rinsed with demineralized water at 20° C. during 120 seconds and dried.

Preparation of Coating Solutions

The following ingredients were used:

an aqueous dispersion of 20 wt. % of polystyrene (Sty) having an average particle diameter of 75 nm stabilized with a surfactant (1.5 wt. % vs. the polymer) in deionized water;

an aqueous dispersion of 20 wt. % of a copolymer (Sty-AN) of styrene and acrylonitrile (Sty/AN=2:1 weight ratio) having an average particle diameter of 60 nm stabilized with a surfactant (1.5 wt. % vs. the polymer) in deionized water;

an aqueous dispersion of 10 wt. % of Novolac (Nov) having an average particle diameter of 100 nm stabilized with a surfactant (2 wt. % vs. the polymer) in deionized water;

Aquadag, a 18 wt. % graphite dispersion (C) in water from Acheson Colloids Company, Port Huron, Mich. USA.

An 1 wt. % aqueous solution (D) of the following IR dye:

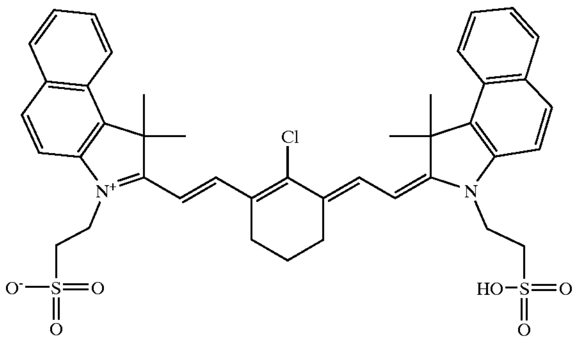

The above ingredients were mixed to obtain the compositions given in the following table:

| Composition | Deionized water | Polymer A | Polymer B | IR-absorber |
|---|---|---|---|---|
| 1 | 51 g | 12 g Sty | 8 g Nov | 1.3 g C |
| 2 | 51 g | 12 g Sty-AN | 8 g Nov | 1.3 g C |
| 3 | 51 g | 8 g Sty | 16 g Nov | 1.3 g C |
| 4 | 51 g | 12 g Sty-AN | 8 g Nov | 27 g D |
| 5 (*) | 51 g | 12 g Sty-AN | — | 27 g D |
| 6 (*) | 51 g | — | 8 g Nov | 27 g D |
| 7 (**) | 51 g | 12 g Sty-AN | 8 g Nov | 1.3 g C |

(*) Comparative example
(**) pH 13

Also 0.6 g of a 10 wt. % aqueous solution of a wetting agent was added as coating aid. These compositions were coated on the above aluminum substrate at a wet coating thickness of 30 g/m$^2$ and dried at 50° C. The materials thus obtained were exposed at 830 nm (Creo Trendsetter, 2540 dpi, 100 rpm drum speed, 500 mJ/cm$^2$) and processed in an Autolith PN85 with EP26 developer, water rinsing and gummed with RC795 gum, all available from Agfa. The printing plates thus obtained were evaluated on a Heidelberg GTO46 press with K+E 800 ink and 4% Combifix+10% isopropanol in water as a fountain.

High quality prints were obtained with the composition according to the invention (1–4). In the material obtained from composition 5, the coating was not completely removed from the substrate in the unexposed areas, resulting in toning during printing. In the material obtained from composition 6, the coating was removed in both the exposed and the unexposed areas (no image). Composition 7 was adjusted to a high pH, so that the novolac particles could dissolve in the coating solution. The material thereby obtained provided low quality prints with some ink uptake in the exposed areas.

We claim:

1. A method of making a negative-working heat-sensitive lithographic printing plate precursor, the method comprising the steps of (a) preparing an aqueous dispersion comprising particles of a hydrophobic thermoplastic polymer A which is not soluble or swellable in an aqueous alkaline developer and particles of a polymer B which is soluble or swellable in an aqueous alkaline developer but not soluble or swellable in water, wherein the glass transition temperature of polymer A is higher than the softening temperature of polymer B;

(b) applying the aqueous dispersion on a lithographic substrate having a hydrophilic surface, thereby obtaining an image-recording layer;

(c) overall heating the image-recording layer at a temperature which is higher than the softening temperature of polymer B without inducing coalescense of the particles of polymer A.

2. A method according to claim 1 wherein during step (c) the image-recording layer is heated at a temperature which is lower than the softening temperature of polymer A.

3. A method according to claim 1 wherein during step (c) the image-recording layer is heated at a temperature which is lower than the glass transition temperature of polymer A.

4. A method according to claim 1 wherein the particles of polymer B comprise a phenolic resin and/or a polymer containing a carboxy group, a sulfonamide group, a nitrile group, a maleimide group or a maleimidosulfadimidine group.

5. A method according to claim 1 wherein the weight ratio of the polymers A/B is larger than 0.5.

6. A method according to claim 1 wherein polymer A comprises at least 5% of units having a solubility parameter higher than 20.

7. A method according to claim 1 wherein polymer A comprises at least 5% of (meth)acrylonitrile units.

8. A method according to claim 1 wherein the particles of polymer A have a number average diameter of less than 200 nm.

9. A method of making a lithographic printing plate comprising the steps of: image-wise exposing a lithographic printing plate precursor to heat or infrared light; and removing non-exposed areas of the image-recording layer with an aqueous alkaline solution, wherein the lithographic printing plate precursor is prepared by a method comprising the steps of:

(a) preparing an aqueous dispersion comprising particles of a hydrophobic thermoplastic polymer A which is not soluble or swellable in an aqueous alkaline developer and particles of a polymer B which is soluble or swellable in an aqueous alkaline developer but not soluble or swellable in water, wherein the glass transition temperature of polymer A is higher than the softening temperature of polymer B;

(b) applying the aqueous dispersion on a lithographic substrate having a hydrophilic surface, thereby obtaining an image-recording layer; and (c) overall heating the image-recording layer at a temperature which is higher than the softening temperature of polymer B without inducing coalescense of the particles of polymer A.

10. A method of making a lithographic printing plate according to claim 9, the method further comprising the step of baking the printing plate at a temperature which is higher than the glass transition temperature of polymer A.

11. A method of making a lithographic printing plate according to claim 9 wherein during step (c) the image-recording layer is heated at a temperature which is lower than the softening temperature of polymer A.

12. A method of making a lithographic printing plate according to claim 9, wherein during step (c) the image-recording layer is heated at a temperature which is lower than the glass transition temperature of polymer A.

13. A method of making a lithographic printing plate according to claim 9, wherein the particles of polymer B comprise a phenolic resin and/or a polymer containing a carboxy group, a sulfonamide group, a nitrile group, a maleimide group or a maleimidosulfadimidine group.

14. A method of making a lithographic printing plate according to claim 9, wherein the weight ratio of the polymers A/B is larger than 0.5.

15. A method of making a lithographic printing plate according to claim 9, wherein polymer A comprises at least 5% of units having a solubility parameter higher than 20.

16. A method of making a lithographic printing plate according to claim 9, wherein polymer A comprises at least 5% of (meth)acrylonitrile units.

17. A method of making a lithographic printing plate according to claim 9, wherein the particles of polymer A have a number average diameter of less than 200 nm.

* * * * *